(12) United States Patent
Lou et al.

(10) Patent No.: US 7,454,682 B2
(45) Date of Patent: Nov. 18, 2008

(54) SYSTEM FOR IDENTIFYING LOCALIZED BURST ERRORS

(75) Inventors: Hanqing Lou, Plano, TX (US); Ahmadreza Hedayat, Allen, TX (US); Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/743,629

(22) Filed: May 2, 2007

(65) Prior Publication Data

US 2008/0092024 A1    Apr. 17, 2008

Related U.S. Application Data

(60) Provisional application No. 60/850,991, filed on Oct. 11, 2006.

(51) Int. Cl.
*H04L 1/18* (2006.01)
*H03M 13/00* (2006.01)
(52) U.S. Cl. ...................... 714/748; 714/762
(58) Field of Classification Search .................. 714/748, 714/761–762, 787–788
See application file for complete search history.

(56) References Cited

U.S. PATENT DOCUMENTS

2005/0120286 A1 *    6/2005    Akamatsu ................... 714/792

FOREIGN PATENT DOCUMENTS

EP             0552781 A2 *    6/1993

* cited by examiner

*Primary Examiner*—Shelly A Chase
(74) *Attorney, Agent, or Firm*—Edell, Shapiro & Finnan, LLC

(57) ABSTRACT

A system for detecting one or more localized burst errors in a receiving message comprised of a plurality of codewords. The system comprises a trellis code decoder for decoding a receiving message with a plurality of codewords and calculating one or more cumulative metrics of a maximum likelihood path and one or more alternative paths from the receiving message, an error detection code (EDC) decoder for detecting existence of one or more errors in the decoded receiving message received from the trellis decoder, and a localized burst error detector activated by the EDC decoder upon detecting the existence of one or more errors in the decoded receiving message to identify at least one corrupted codeword among the plurality of codewords using the one or more cumulative metrics of a maximum likelihood path and the one or more alternative paths, wherein the system requests the re-transmission of the corrupted codeword.

19 Claims, 3 Drawing Sheets

SYSTEM FOR IDENTIFYING LOCALIZED BURST ERRORS

CROSS REFERENCE

The present application claims the benefit of U.S. Provisional Application Ser. 60/850,991, which was filed on Oct. 11, 2006.

BACKGROUND

Trellis codes, such as convolutional codes, trellis coded modulation, and bit-interleaved coded modulations, have been widely used to improve the performance of a wireless communications system. A trellis code encoder inserts redundant bits to an original message, whereas a trellis code decoder utilizes the redundant bits to recover the original message that may be corrupted by channel noise. However, it is still possible that the trellis code decoder fails to recover the original message as a result of severe channel noise. In other words, whether the original message will be retrieved correctly is related to the severity of channel noise and the quantity of the redundant bits.

Most wireless communications systems rely on the error detection code (EDC), such as the cyclic redundancy check (CRC), to ensure that a message decoded by a trellis code decoder is correct. The CRC coding method pads an original message with parity bits. After a trellis code decoder decodes the receiving message, an EDC decoder further examines whether there is a CRC error in the receiving message. The detection of a CRC error indicates that one or more bit errors exist in the decoded message. In a wireless communications system employing automatic repeat-request (ARQ), the receiver can request the sender to re-transmit the message.

A message is divided into segments in some wireless communications systems. Each segment is encoded by a convolutional code and subsequently, a codeword is formed for each segment. The EDC is used to protect the original message before it is divided into segments. When an EDC decoder detects a CRC error in the receiving message, the receiver cannot distinguish the one or more codewords with an error from those without one. Therefore, the receiver requests the transmitter to re-transmit all the codewords of the message.

In reality, the probability that there is an error in each of the codewords of a message is very small. It is inefficient for a wireless communications system to re-transmit all the codewords when only one or a few of them have errors. The efficiency of the system can be greatly improved by detecting and re-transmitting only the codeword or codewords that have an error.

As such, what is desired is a method and system for identifying codewords with localized burst errors, re-transmitting only the corrupted codewords, rather than all the codewords comprising the whole message, and thereby improving the efficiency of a wireless communications network.

SUMMARY

The present invention discloses a system for detecting one or more localized burst errors in a receiving message comprised of a plurality of codewords. The system comprises a trellis code decoder for decoding a receiving message with a plurality of codewords and calculating one or more cumulative metrics of a maximum likelihood path and one or more alternative paths from the receiving message, an error detection code (EDC) decoder for detecting existence of one or more errors in the decoded receiving message received from the trellis decoder, and a localized burst error detector activated by the EDC decoder upon detecting the existence of one or more errors in the decoded receiving message to identify at least one corrupted codeword among the plurality of the codewords using the one or more cumulative metrics of a maximum likelihood path and the one or more alternative paths, wherein the system requests the re-transmission of the corrupted codeword.

The construction and method of operation of the invention, however, together with additional objects and advantages thereof, will be best understood from the following description of specific embodiments when read in connection with the accompanying drawings.

BRIEF DESCRIPTION OF THE DRAWING

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DESCRIPTION

The following detailed description of the invention refers to the accompanying drawings. The description includes exemplary embodiments, not excluding other embodiments, and changes may be made to the embodiments described without departing from the spirit and scope of the invention. The following detailed description does not limit the invention. Instead, the scope of the invention is defined by the appended claims.

One embodiment of the present invention determines localized burst errors in a message based on the cumulative metrics of a maximum likelihood (ML) path and all alternative paths, generated by the ML trellis code decoder employing the Viterbi algorithm. If a decoded message contains a cyclic redundancy check (CRC) error, the codewords that have burst errors are identified and re-transmitted. Since the retransmission only involves the codewords with burst errors, the efficiency of the network is not jeopardized.

Assume that an original message is padded with J parity bits based on the error detection code (EDC). The EDC coded message is then divided into N segments. After a trellis code encoder encodes each of the segments, a codeword of a length L is formed.

A trellis code decoder applies the Viterbi algorithm, which is based on the maximum likelihood (ML) algorithm, to a codeword after it is received. It can also apply the Viterbi algorithm to all N codewords after they are received. The Viterbi algorithm finds an ML path, i.e. the one with the smallest metric or Euclidian distance, in order to recover the original message. Subsequently the EDC decoder decodes the receiving message decoded by the trellis code decoder. The EDC decoder determines the accuracy of the receiving message by checking if a CRC error exists in the receiving message. In other words, the decoded message is deemed inaccurate if a CRC error is present.

Figure 1:
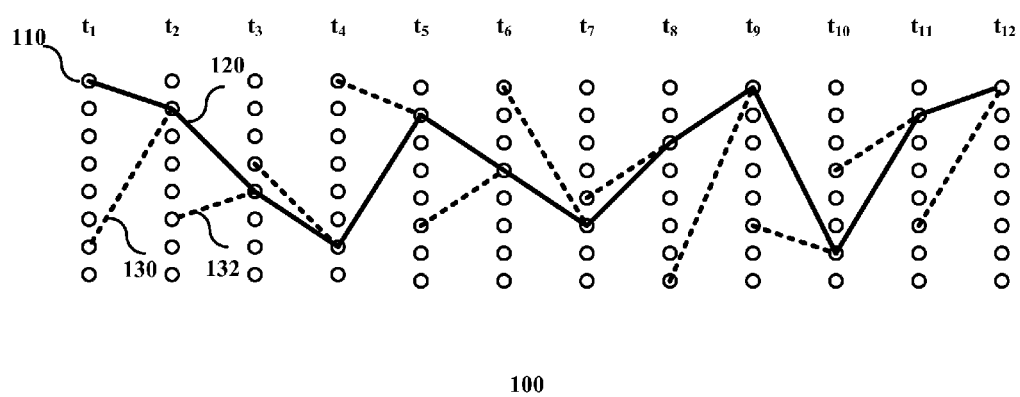
FIG. 1 shows a decoding process of a trellis code decoder that employs the Viterbi Algorithm.

FIG. 1 shows a decoding process of a trellis code decoder that employs the Viterbi algorithm. A circle 110 represents one of the possible states of a trellis code decoder at time instance $t_i$. There are eight states in the present example. After the decoding process is complete, the Viterbi algorithm finds an ML path 120 from time instance $t_1$ to time instance $t_{12}$, shown by a solid line. Moreover, segments 130 and 132 of alternative paths are identified and shown by dash lines.

An alternative path is a path that follows the ML path of the decoded message for a period of time, diverges from it at time instance i, and merges with it at time instance j, where i<j. In FIG. 1, the segment 130 of an alternative path from $t_1$ to $t_2$ joins the ML path 120 at $t_2$. In addition, the segment 132 of another alternative path from $t_2$ to $t_3$, joins the ML path 120 at $t_3$. The trellis code decoder computes the cumulative metrics of the ML path 120 and all the alternative paths.

A symbol $\Delta_k$ represents the absolute difference between cumulative metrics of the ML path and an alternative path at time instance k. All the $\Delta_k$, each of which corresponds one alternative path, are stored in a list L. The elements in the list L are sorted in an ascending order, and a predetermined number of elements, namely $\Delta_i$, are selected from the beginning of the list to form an ordered list $\tilde{L}$, where $\Delta_1 < \Delta_2 < \ldots < \Delta_{\tilde{M}}$.

After the receiving message is decoded by the trellis code decoder, it is decoded by the EDC decoder. If there is a CRC error in the decoded receiving message, the localized burst error detector identifies one or more codewords with the localized burst errors based on the ordered list $\tilde{L}$.

The concentration of errors in a receiving message is determined by the detection function of a localized burst error detector. The detection function identifies the localized burst errors based on the absolute differences between cumulative metrics of the ML path and alternative paths.

A symbol $\Delta_j$ denotes the absolute difference between cumulative metrics of the ML path of the message and an alternative path of the message at time instance j. The cumulative metric of an alternative path of the message is denoted as $M_{ML}+\Delta_j$, where $M_{ML}$ is the cumulative metric of the ML path of the message.

Let min( . . . ) be a function that identifies the smallest $\Delta_j$ from the list L and $\Delta_{min}=\min_k(\Delta_k)$. The alternative path with the smallest cumulative metric, denoted as $M_{ML}+\Delta_{min}$, is identified as the alternative path that has localized burst errors at one or more time instances adjacent to time instance k.

Figure 2:
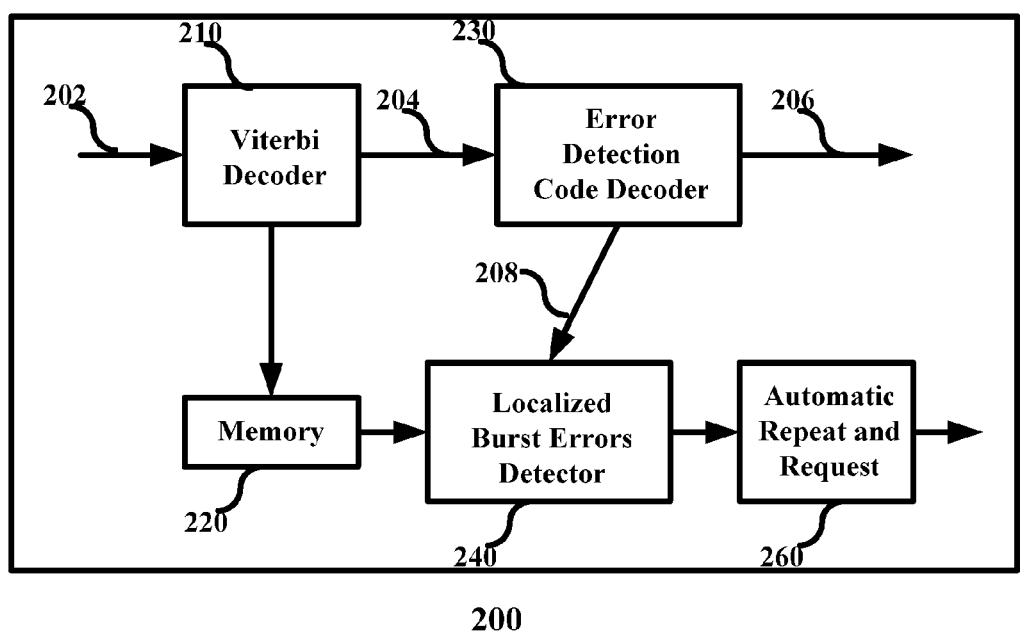
FIG. 2 is a block diagram illustrating a system in accordance with an embodiment of the present invention.

FIG. 2 is a block diagram illustrating a system 200 in accordance with an embodiment of the present invention. The system 200 is a component in the receiver chain of a wireless receiver. An input receiving bit stream 202 is sent to a trellis code decoder 210 employing the Viterbi algorithm. The trellis code decoder 210 calculates the metrics of an ML path and alternative paths of a receiving message, and the metrics are stored in a memory module 220. A decoded message 204 is sent to an EDC decoder 230. If the EDC decoder 230 does not detect any CRC error, the message 206 is sent to the remaining processing unit of the receiver chain.

If the EDC decoder 230 detects a CRC error, a signal 208 is sent to a localized burst error detector 240, which has a detection function that finds the localized burst errors and identifies codewords with the highest concentration of localized burst errors. The localized burst error detector 240 performs a series of operations. First, it retrieves the metrics of an ML path and alternative paths of the receiving message from the memory module and generates an ordered list $\tilde{L}$. Second, it uses the information in the ordered list $\tilde{L}$ to identify one or more codewords with localized burst errors. Last, it sends the information about the one or more codewords with localized burst errors to the Automatic Repeat and Request module to request the retransmission of the one or more codewords that are corrupted in the previous transmission.

One embodiment of the localized burst error detector 240 in FIG. 2 employs a majority vote algorithm. This algorithm is most suitable for a network that is less tolerant of retransmission delay but permits a large number of retransmissions. The embodiment is based on hard decision to detect one or more codewords with localized burst errors.

The localized burst error detector 240 employing the majority vote algorithm computes a total number of elements in the list $\tilde{L}$ corresponding to a codeword for all codewords. The codeword that has the most elements in the ordered list $\tilde{L}$ is identified as one with localized burst errors. If multiple codewords have the same number of elements in the ordered list $\tilde{L}$, they all are considered as codewords with localized burst errors.

Figure 3:
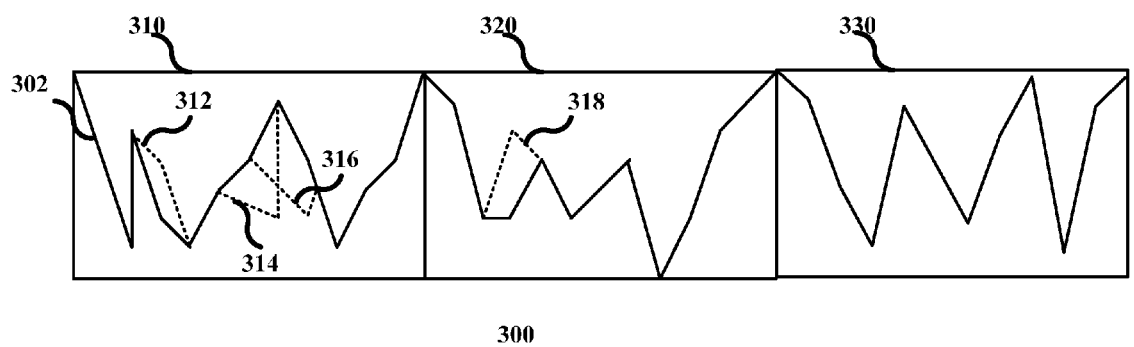
FIG. 3 shows an example that further illustrates determinations of localized burst errors in accordance with an embodiment of the present invention.

FIG. 3 is an example that further illustrates determinations of localized burst errors in accordance with one embodiment of the present invention. The number of elements in an ordered list $\tilde{L}$ is denoted as M. FIG. 3 shows a decoding process of a message comprising codewords 310, 320 and 330. In addition to an ML path 302, there are 4 alternative paths in the example. The codeword 310 has three alternative paths 312, 314, and 316 in the ordered list $\tilde{L}$ while the codeword 320 has one alternative path 318 in the ordered list $\tilde{L}$. There is no alternative path for the codeword 330. If the receiving message contains a CRC error, it is most likely that localized burst errors occur in the codeword 310 and it is almost impossible that errors occur in the codeword 330.

One embodiment of the localized burst error detector 240 employs an algorithm using soft information to assign a weight to each element in the ordered list $\tilde{L}$ and summing the weighted values of the elements in the ordered list $\tilde{L}$ corresponding to all the codewords. The codeword with the largest value is identified as one with localized burst errors.

A weight assigned to each element in the ordered list $\tilde{L}$ can be obtained by the following exemplary probability algorithm. The localized burst error detector 240 calculates a value Q ($Q=SNR^{-\Delta_j}$) for each element in the list $\tilde{L}$, where SNR is the signal to noise ratio of a wireless communication channel and $\Delta_j$ is the absolute difference between cumulative metrics of the ML path of the message and an alternative path of the message at time instance j. The value of Q is proportional to the probability of errors.

The localized burst error detector 240 employing a probability algorithm described above estimates the probability of errors for each codeword by taking into consideration all the information pertaining to the codeword. For instance, the Qs of all the codewords are summed and the codeword with the highest Q is regarded as the one with localized burst errors.

The method disclosed in the present invention is applicable to trellis code termination using a zero-padding method or a tail-biting method. If a trellis code decoder decodes a codeword with tail-biting termination, the ML path is not identified in its original order. Instead, the front portion of the ML path is identified only after the rest of the ML path is constructed. All the paths, including the ML path and alternative paths, converge at the same state, which is the termination point. This observation does not affect the method disclosed in the present invention because the construction of an ordered list $\tilde{L}$ does not depend on how the ML path is constructed.

The method disclosed in the present invention is also applicable to decoders that perform sliding-window decoding or non-sliding window decoding. An ordered list $\tilde{L}$ can be constructed as long as the ML path of a message is identified. The ML path is determined either by a single trace-back method or a multiple partial trace-back method.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A system for detecting one or more localized burst errors in a receiving message comprised of a plurality of codewords, the system comprising:
  a trellis code decoder for decoding a receiving message with a plurality of codewords and calculating one or more cumulative metrics of a maximum likelihood path and one or more alternative paths from the receiving message;
  an error detection code (EDC) decoder for detecting existence of one or more errors in the decoded receiving message received for the trellis decoder; and
  a localized burst error detector activated by the EDC decoder upon detecting the existence of one or more errors in the decoded receiving message to identify at least one corrupted codeword among the plurality of the codewords using the one or more cumulative metrics of a maximum likelihood path and the one or more alternative paths,
  wherein the system requests the re-transmission of the corrupted codeword.

2. The system of claim 1, wherein the localized burst error detector comprises a module configured to calculate one or more absolute differences between cumulative metrics of the maximum likelihood path and the one or more alternative paths.

3. The system of claim 2, wherein the one or more absolute differences between the cumulative metrics of the maximum likelihood path and the one or more alternative paths are stored in a memory module.

4. The system of claim 3, wherein the localized burst error detector retrieves a predetermined number of the one or more smallest absolute differences from the memory module and forms a list $\tilde{L}$.

5. The system of claim 4, wherein the localized burst error detector computes a total number of elements in the list $\tilde{L}$ corresponding to all the codewords.

6. The system of claim 5, wherein the localized burst error detector identifies a codeword that has the most elements in the list $\tilde{L}$ and regards it as the codeword with at least one localized burst error.

7. The system of claim 5, wherein the localized burst error detector identifies two or more codewords that have the most elements in the list $\tilde{L}$ and regards them as the codewords with at least one localized burst error.

8. The system of claim 4, wherein the localized burst error detector determines one or more localized burst errors in a plurality of codewords by calculating a value Q ($Q=SNR^{-\Delta_j}$) for each element in the list $\tilde{L}$, where SNR is the signal to noise ratio of a wireless communication channel and $\Delta_j$ is the absolute difference between cumulative metrics of the maximum likelihood path of the message and an alternative path of the message at time instance j.

9. The system of claim 8, wherein the value Q is proportional to the probability of errors.

10. The system of claim 8, wherein the localized burst error detector sums all the Qs of a codeword.

11. The system of claim 8, wherein the localized burst error detector identifies the codeword with the highest Q and regards it as the codeword with at least one localized burst error.

12. A system for detecting one or more localized burst errors in a decoded receiving message comprised of a plurality of codewords, the system comprising:
  a trellis code decoder for decoding at least one receiving message with a plurality of codewords and for calculating one or more cumulative metrics of a maximum likelihood path and one or more alternative paths from the receiving message;
  an error detection code (EDC) decoder for detecting existence of one or more errors in the decoded receiving message received from the trellis decoder; and
  a localized burst error detector activated by the EDC decoder upon detecting the existence of one or more errors in the decoded receiving message to identify at least one corrupted codeword among the plurality of the codewords by using a module configured to calculate one or more absolute differences between cumulative metrics of the maximum likelihood path and the one or more alternative paths, to retrieve a predetermined number of the one or more smallest absolute differences from the memory module, and to form a list $\tilde{L}$,
  wherein the system requests the re-transmission of the corrupted codeword.

13. The system of claim 12, wherein the localized burst error detector computes a total number of elements in the list $\tilde{L}$ corresponding to all the codewords.

14. The system of claim 13, wherein the localized burst error detector identifies a codeword that has the most elements in the list $\tilde{L}$ and regards it as the codeword with at least one localized burst error.

15. The system of claim 14, wherein the localized burst error detector identifies two or more codewords that have the most elements in the list $\tilde{L}$ and regards them as the codewords with at least one localized burst error.

16. The system of claim 13, wherein the localized burst error detector determines one or more localized burst errors in a plurality of codewords by calculating a value Q ($Q=SNR^{-\Delta_j}$) for each element in the list $\tilde{L}$, where SNR is the signal to noise ratio of a wireless communication channel and $\Delta_j$ is the absolute difference between cumulative metrics of the maximum likelihood path of the message and an alternative path of the message at time instance j.

17. The system of claim 16, wherein the value Q is proportional to the probability of errors.

18. The system of claim 16, wherein the localized burst error detector sums all the Qs of a codeword.

19. The system of claim 16, wherein the localized burst error detector identifies the codeword with the highest Q and regards it as the codeword with at least one localized burst error.

* * * * *